US008045732B1

(12) United States Patent
Goodwin et al.

(10) Patent No.: US 8,045,732 B1
(45) Date of Patent: Oct. 25, 2011

(54) MAPPING CONTROL SIGNALS TO VALUES FOR ONE OR MORE INTERNAL PARAMETERS

(75) Inventors: Michael Goodwin, Scotts Valley, CA (US); Carlos Avendano, Campbell, CA (US); Ramkumar Sridharan, Capitola, CA (US); Martin Wolters, Nuremberg (DE)

(73) Assignee: Creative Technology Ltd, Singapore (SG)

( * ) Notice: Subject to any disclaimer, the term of this patent is extended or adjusted under 35 U.S.C. 154(b) by 1521 days.

(21) Appl. No.: 10/812,845

(22) Filed: Mar. 29, 2004

(51) Int. Cl.
*H03G 3/00* (2006.01)
*H04B 1/00* (2006.01)

(52) U.S. Cl. .................... 381/104; 381/119
(58) Field of Classification Search ............ 381/119, 381/118, 104, 109, 98, 102, 56, 58, 61
See application file for complete search history.

(56) References Cited

U.S. PATENT DOCUMENTS

| | | | |
|---|---|---|---|
| 6,442,281 B2 * | 8/2002 | Sato et al. | 381/119 |
| 6,892,249 B1 * | 5/2005 | Codilian et al. | 710/5 |
| 6,967,452 B2 * | 11/2005 | Aiso et al. | 381/119 |

OTHER PUBLICATIONS

Carlos Avendano and Jean-Marc Jot: *Ambience Extraction and Synthesis from Stereo Signals for Multi-Channel Audio Up-Mix*; vol. II—1957-1960: © 2002 IEEE.
Jean-Marc Jot and Carlos Avendano: *Spatial Enhancement of Audio Recordings*; AES 23rd International Conference, Copenhagen, Denmark, May 23-25, 2003.
Carlos Avendano: *Frequency-Domain Source Identification and Manipulation in Stereo Mixes for Enhancement, Suppression and Re-Panning Applications*; 2003 IEEE Workshop on Applications of Signed Processing to Audio and Acoustics; Oct. 19-22, 2003, New Paltz, NY.

* cited by examiner

*Primary Examiner* — Ping Lee

(57) ABSTRACT

Mapping a plurality of external control signals to values for one or more internal parameters is disclosed. Each external control signal is mapped to a control signal-specific set of internal parameter values corresponding to the level of the signal. The resulting signal-specific sets of internal parameter values are combined to generate a combined set of internal parameter values. The combined set of internal parameter values includes a single value for each internal parameter for which a value was included in at least one signal-specific set of internal parameter values. For each internal parameter for which a value is included in more than one of the signal-specific sets of internal parameter values, the combined set of internal parameter values includes a combined value based at least in part on the values included in the signal-specific sets of internal parameter values.

24 Claims, 11 Drawing Sheets

LINEAR APPROACH

EQUAL INCREMENT APPROACH

MAPPING CONTROL SIGNALS TO VALUES FOR ONE OR MORE INTERNAL PARAMETERS

INCORPORATION BY REFERENCE

Co-pending U.S. patent application Ser. No. 10/606,196 entitled TRANSIENT DETECTION AND MODIFICATION IN AUDIO SIGNALS filed Jun. 24, 2003, is incorporated herein by reference for all purposes. Co-pending U.S. patent application Ser. No. 10/606,373 entitled ENHANCING AUDIO SIGNALS BY NONLINEAR SPECTRAL OPERATIONS filed Jun. 24, 2003, is incorporated herein by reference for all purposes. U.S. patent application Ser. No. 10/738,361, now U.S. Pat. No. 7,412,380, entitled AMBIENCE EXTRACTION AND MODIFICATION FOR ENHANCEMENT AND UPMIX OF AUDIO SIGNALS filed Dec. 17, 2003, is incorporated herein by reference for all purposes. Co-pending U.S. patent application Ser. No. 10/738,607 entitled EXTRACTING AND MODIFYING A PANNED SOURCE FOR ENHANCEMENT AND UPMIX OF AUDIO SIGNALS filed Dec. 17, 2003, is incorporated herein by reference for all purposes. Co-pending U.S. patent application Ser. No. 10/812,494 entitled DYNAMIC MODIFICATIO OF A PERCEPTUAL ATTRIBUTE OF AN AUDIO SIGNAL filed concurrently herewith, is incorporated herein by reference for all purposes.

FIELD OF THE INVENTION

The present invention relates generally to control signals. More specifically, combining potentially conflicting control signals is disclosed.

BACKGROUND OF THE INVENTION

A user interface, such as a set of controls, may be configured to allow a user to select directly a desired level for a parameter used by a system to perform some operation or produce some result. One example of such a control is a simple volume control on a consumer device such as a television or radio, which enables a user to select directly a desired level of loudness. A typical rotary or slider type volume control may comprise a potentiometer (variable resistor) configured as a variable voltage divider such that the position of the control determines directly the level of the input signal voltage that goes to the amplifier.

In some cases, however, there may not be a direct, one-to-one relationship between a user control and an internal parameter that is affected by the control. This may be the case, for example, whenever the user relates to an experience, such as hearing an audio signal as rendered, in a way that does not translate directly into the operations performed by the system being controlled via the user control, such as a digital signal processing system. In some cases, it may be necessary to generate values for two or more internal parameters based on a single externally provided control signal, such as a user input received via a user control or other interface. As a result, there is a need for a way to derive from an external control signal a set of values for one or more internal parameters.

In addition, one or more distinct processing modules may be used to perform different types of operations in response to an external control signal, such as an input received from a user via a user control. For example, a signal processing system may be configured to use one or more of a plurality of processing modules to process an audio (or other) signal. Such a system may provide to a user more than one control interface (e.g., a plurality of knobs, sliders, or other controls, or one or more controls for selecting a preset group of two or more separate settings) to enable a user to indicate a desired level of more than one desired quality of the signal as rendered. In some cases, a single control or setting may affect the internal parameter values for more than one processing module. It is also possible for two controls to affect the level of one or more parameters for the same processing module, possibly in ways that conflict. In such systems, there is a need for a way to combine and reconcile the potentially conflicting user inputs (or other control signals) to generate a combined set of parameters for the various processing modules.

BRIEF DESCRIPTION OF THE DRAWINGS

Various embodiments of the invention are disclosed in the following detailed description and the accompanying drawings.

DETAILED DESCRIPTION

Figure 1:
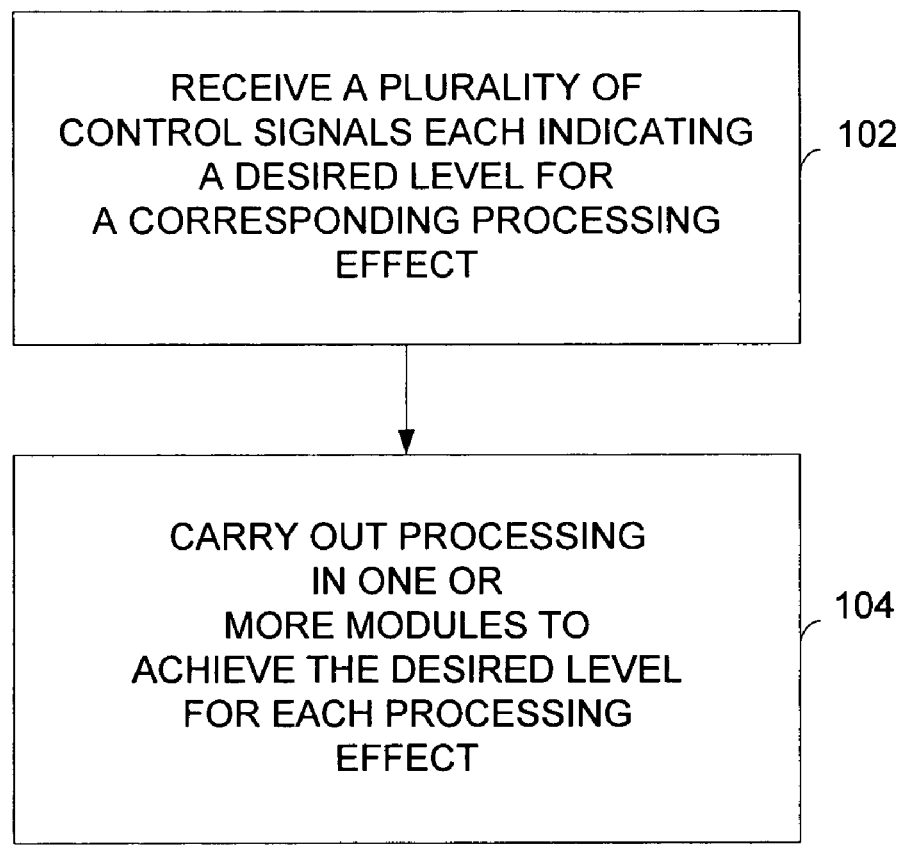
FIG. 1 is a flow chart illustrating a process used in one embodiment to receive control signals and process an audio signal as indicated by the control signals.

The invention can be implemented in numerous ways, including as a process, an apparatus, a system, a composition of matter, a computer readable medium such as a computer readable storage medium or a computer network wherein program instructions are sent over optical or electronic communication links. In this specification, these implementations, or any other form that the invention may take, may be referred to as techniques. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Generating internal parameters based on external control signals is disclosed. In one embodiment, a control signal, such as a user input, is mapped to values for one or more internal parameters. In one embodiment, an expert, such as a sound designer in the case of an audio digital signal processing system, determines for a limited number of discrete set points for the external control signal a corresponding set of values for the one or more parameters. In one embodiment, for control signal levels between the set points values for the one or more parameters are generated by interpolation.

Combining potentially conflicting control signals is also disclosed. For each of a plurality of control signals, the signal is mapped to one or more internal parameters. For each such parameter that is not unique, in the sense that another control signal has also been mapped to a value for that parameter, all of the values generated for the parameter are combined to determine a final, combined value for the parameter.

Processing systems, and in particular modular processing systems, may receive two or more control signals, e.g., user inputs that could potentially conflict. For example, as noted above an audio signal processing system may comprise a plurality of processing modules each configured to process audio signals in a different way, such as by enhancing or suppressing transients; enhancing or suppressing vocal or other components, such as panned sources; enhancing or suppressing ambience; performing other linear or nonlinear spectral operations; etc. Examples of such processing are described in the co-pending U.S. Patent Applications incorporated herein by reference above. Some such systems may provide two or more external user controls, the respective settings of which may map to one or more internal parameters used by one or more of the processing modules to process the audio signal in a way that achieves a desired quality in the audio signal as rendered.

For example, the sound recording as rendered may have a high order perceptual attribute that is not pleasing to the listener, or may lack a high order perceptual attribute desired by the listener, or the high order perceptual attribute may be present to a degree not fully pleasing to the listener. As used herein, a "high order perceptual attribute" is a characteristic of an audio signal associated with a sound recording as rendered to a listener that depends both on (1) the content of the audio signal, as determined both by the original sound recorded to make the sound recording and any processing performed in producing the final sound recording made available to be rendered to the listener, and (2) the characteristics of the playback equipment used to render the audio signal and the effects of any further processing performed on the audio signal prior to its being rendered to the listener. A high order perceptual attribute is distinguishable from gross attributes, such as loudness, static, or the presence of noise and/or other unwanted components or artifacts, in that a high order perceptual attribute describes fine distinctions in the manner in which the essential components of the audio signal are reproduced and rendered while maintaining the basic integrity of the underlying performance, much like the right combination of herbs and spices can bring out different aspects of the flavor of a food or a carefully selected stain can highlight (or deemphasize or mask) features in the grain of piece of wood in a particular desired way. A high order perceptual attribute is "perceptual" in the sense that it is discernable to at least a trained or skilled listener, and such a listener can describe at least in relative terms the extent which it is present or not in an audio signal as rendered using reasonably precise language that by usage or convention conveys to other listeners the extent to which a particular recognizable quality is present. Examples of such high order perceptual attributes as they have been described in sound recording and audio equipment literature, for example, include "punch" (good reproduction of dynamics and good transient response with strong impact); "presence" or "closeness" (the sense that a particular instrument, e.g., is present in the listening room); "warmth" (easy on the ears, not harsh); "spaciousness" (conveying a sense of space, ambiance, or room around the instruments and/or other sound sources); "fatness" (fullness of sound, increased energy in the upper bass region); and "clarity" or "transparency" (easy to hear into the music; detailed, not distorted). Such attributes are inherently subjective and, as such, the rough definitions provided in parentheses above are provided only by way of example.

Co-pending U.S. Application Ser. No. 10/812,494, entitled "Dynamic Modification Of A High Order Perceptual Attribute Of An Audio Signal," filed Mar. 29, 2004 and incorporated herein by reference above, discloses dynamic modification of a high order perceptual attribute of an audio signal. In an embodiment in which an external control signal, such as a user input, may be used to indicate a desired level of a high order perceptual attribute, there is a need for a way to map the control signal level to a set of one or more internal parameters for the signal processing module(s) used to modify the audio signal to achieve the desired level for the perceptual attribute. In an embodiment in which two or more high order perceptual attributes of an audio signal may be modified, there is also a need for a way to reconcile the potentially conflicting signal processing module parameters that correspond to the respective desired levels of the attributes being modified.

FIG. 1 is a flow chart illustrating a process used in one embodiment to receive control signals and carry out processing as indicated by the control signals. In step 102, two or more control signals are received, each control signal indicating a desired level for a corresponding processing effect. In step 104, the processing is carried out using one or more processing modules to achieve the desired level for each respective processing effect. In one embodiment, the processing may comprising processing an audio signal. In one such embodiment, the audio signal may be processed using one or more digital signal processing modules. In one embodiment, one or more of the control signals may comprise and/or be derived from user inputs received via a user interface. In one embodiment, one or more of the processing effects may comprise a perceptual attribute of an audio signal as rendered.

Figure 2A:
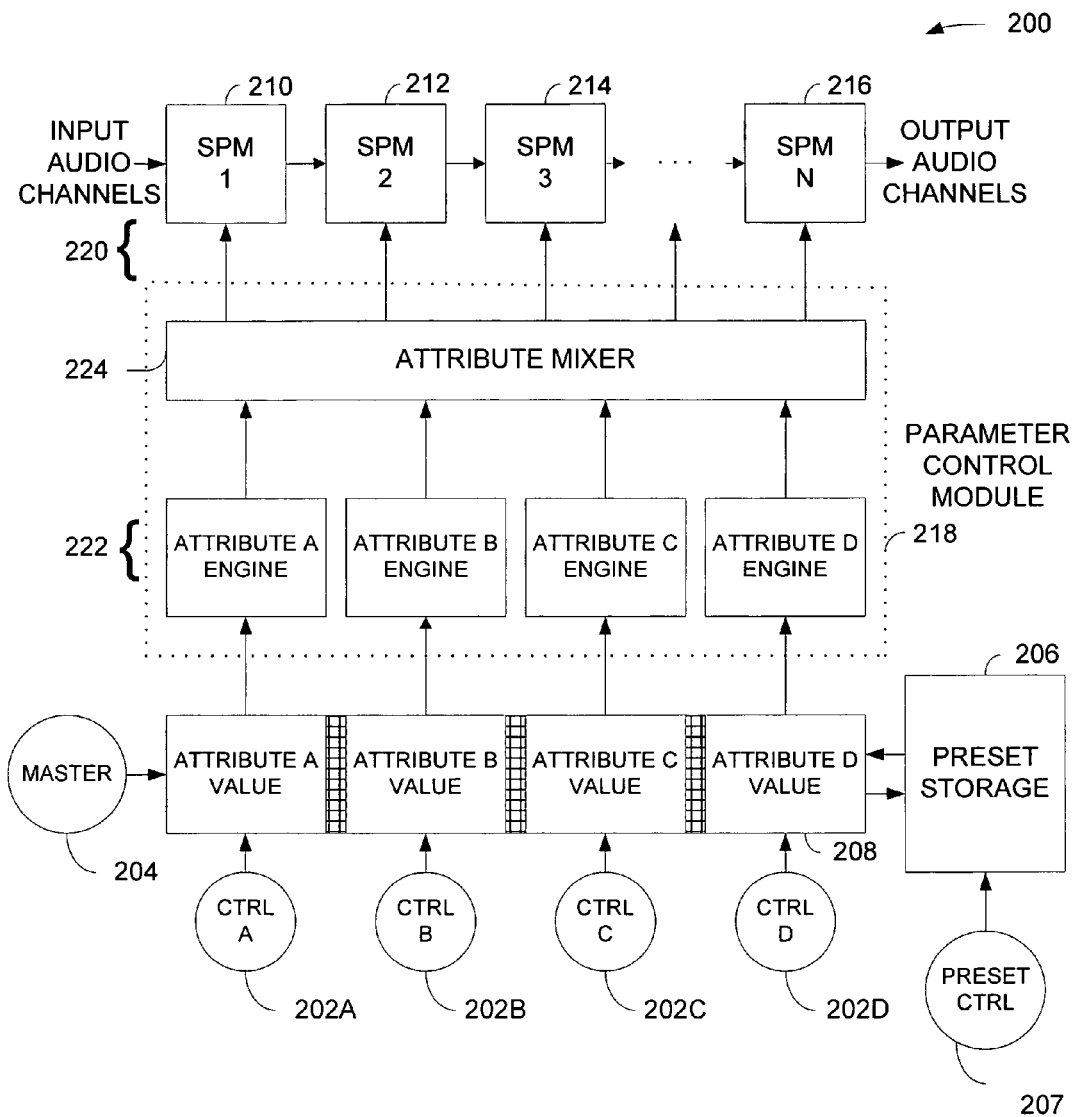
FIG. 2A is a block diagram illustrating processing system used in one embodiment to achieve a processing effect as indicated by a plurality of control signals.

FIG. 2A is a block diagram illustrating processing system used in one embodiment to achieve a processing effect as indicated by a plurality of control signals. In the embodiment shown in FIG. 2A, the processing system 200 comprises an audio signal processing system configured to achieve a desired level of one or more of a plurality of perceptual attributes of the audio signal as rendered, as indicated by a plurality of control signals, e.g., user inputs. The system 200 comprises a plurality of perceptual attribute controls 202a-202d. Each of the perceptual attribute controls 202a-202d may be configured to receive an input from a user indicating a desired level for a perceptual attribute associated with the control, such as "punch", "warmth", etc., indicated in FIG. 2A as perceptual attributes A-D. A master control 204, described more fully below, may optionally be included to allow a user to simultaneously adjust the level of all four perceptual attributes A-D. A preset storage 206 may optionally be provided to enable the storage of one or more factory and/or user designated preset values for the respective attribute controls 202a-202d. A preset control 207 may optionally be provided to enable a user to select a set of preset values for the attribute controls. An attribute value generation block 208 comprises a plurality of attribute-specific modules each configured to generate a value for the attribute control with which it is associated based on a level indicated via the individual attribute control, the master control, or a preset stored in preset storage 206. The system 200 comprises a plurality of signal processing modules 210, 212, 214, and 216, which as indicated in FIG. 2A may comprise any number of signal processing modules. Each signal processing module may in one embodiment be used to perform a different type of processing on the audio signal, such as by operating on a different feature or component of the audio signal (e.g., transients, other spectral events, vocal components, other panned sources, ambience, etc.). A parameter control module 218 receives as input the individual attribute values generated by the attribute value generation block 208 based on the user-provided settings of the individual perceptual attribute controls 202a-202d and/or the master control 204. The parameter control module 218 processes the attribute values to generate a set of signal processing module (SPM) parameters 220, which are provided as inputs to the signal processing modules 210-216.

In one embodiment, the SPM parameters 220 comprise one or more SPM-specific parameters for each SPM. More than one attribute value provided by the attribute value generation block 208 may map to an indicated or desired value for a particular SPM parameter. For example, an attribute control for "punch" and one for "warmth" may both be associated with corresponding values for one or more parameters to an SPM configured to enhance or suppress transients. In fact, a high setting for both "punch" and "warmth" might tend to pull the "transient" SPM in opposite directions. In the embodiment shown, the parameter control module 218 is configured to combine such potentially conflicting user inputs to generate a single combined or reconciled value for each SPM parameter. In the embodiment shown, the parameter control module 218 comprises a plurality of attribute engines 222, one for each perceptual attribute for which an attribute value is received. The respective attribute engines 222 are configured to map the attribute value received from the attribute value generation block 208 for the attribute to a set of one or more SPM parameter values, for one or more different signal processing modules, that correspond to the desired level for the perceptual attribute. The parameter control module 218 further includes an attribute mixer 224. The attribute mixer 224 is configured to receive from the respective attribute engines 222 the SPM parameter values corresponding to the attribute values associated with each respective attribute and to combine and/or reconcile any conflicts by generating a combined value for any SPM parameter for which more than one value has been generated by the attribute engines 222, for example because two different attribute values mapped to a value for the same SPM parameter. The attribute mixer 224 provides a combined and reconciled set of SPM parameter values to the SPM's, which process the audio signal based at least in part on the values of the parameters.

In some embodiments, the SPM's 210-216 may comprise one or more signal processing modules such as those described in the co-pending U.S. Patent Applications incorporated herein by reference above. Examples of SPM parameters described in said applications include gains; exponents; slopes; coefficients; modification factors; and maximum, minimum, and/or threshold values for these or other SPM parameters.

In an alternative embodiment, one or more sets of "system level" presets may be stored in a "system level preset storage" area or device, not shown in FIG. 2A, to enable the selection or other use of a set of preset values for the internal parameters used by the signal processing modules 210-216. In such an embodiment, if a system level preset is selected or otherwise used the parameter control module 218 of FIG. 2A is bypassed and the internal parameter values of the system level preset are provided as inputs directly to the signal processing modules 210-216.

Figure 2B:
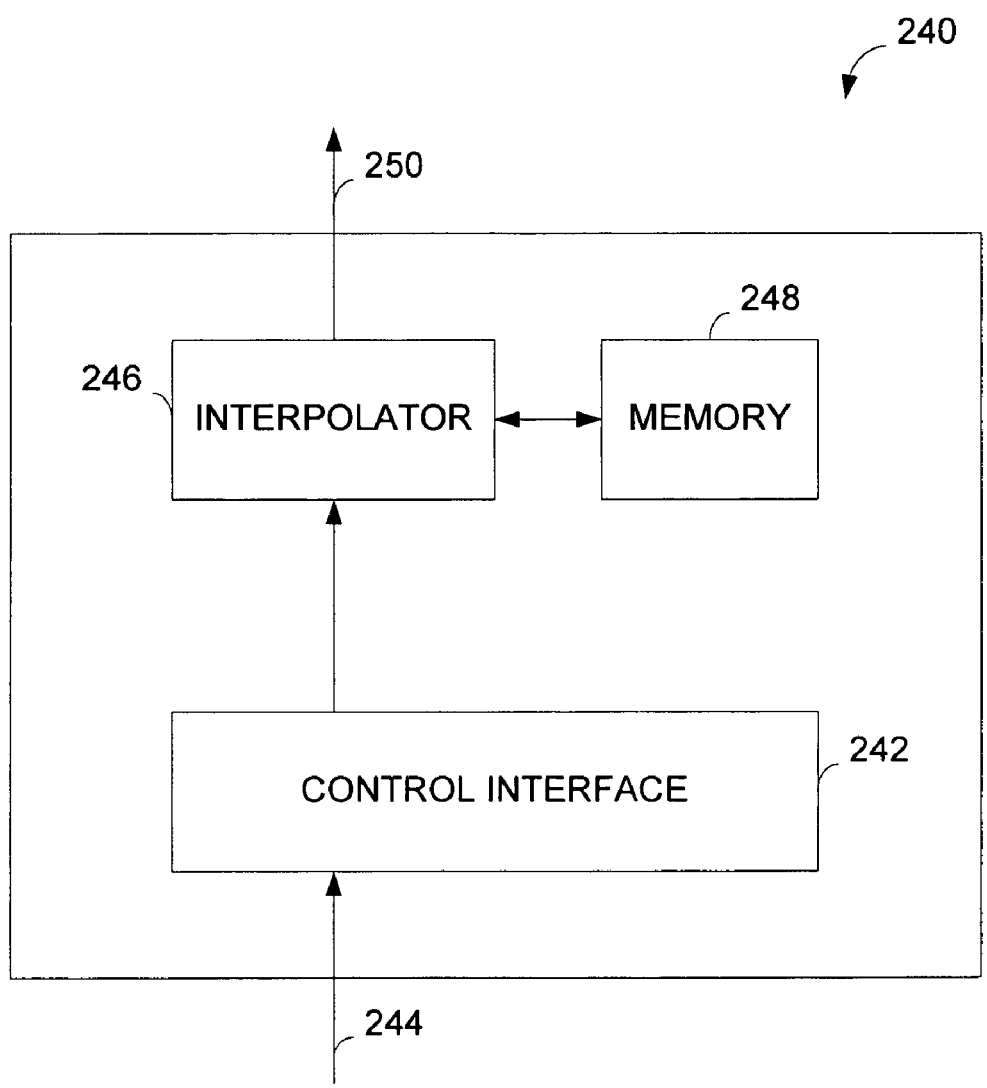
FIG. 2B is a block diagram illustrating an attribute engine used in one embodiment.

FIG. 2B is a block diagram illustrating an attribute engine used in one embodiment. In one embodiment, each of the attribute engines 222 of FIG. 2A comprises an attribute engine such as attribute engine 240 of FIG. 2B. The attribute engine 240 comprises a control interface 242 configured to receive a control signal 244, such as a signal provided by a control such as controls 202a-202d of FIG. 2A. The control interface 242 determines the level of the control signal 244 and provides the level information to an interpolator 246. A memory 248 is used to store for each of a predetermined number of predetermined control signal levels a set of internal parameter values associated with the control signal level. In one embodiment, a sound designer or other expert determines for each of the predetermined control signal levels the internal parameter values that will be associated with that control signal level. The predetermined levels may be distributed through the range of possible control signal values, to provide representative set points throughout the range. For example, the minimum value for the control signal, the maximum value, and one or more intermediate values may be included in the set of predetermined control signal levels for which corresponding internal parameter values are stored in memory 248. In the case of an audio processing system configured to adjust a high order perceptual attribute of an audio signal, the sound designer will choose values for the internal parameters that yield the desired effect, e.g., minimal or no presence of the perceptual attribute for the minimum control signal level, maximum presence of the attribute for the maximum control signal level, and suitable intermediate levels for the intermediate set points. In one embodiment, if the control signal level indicated by the control interface 242 does not correspond to one of the predetermined control signal levels for the which the memory 248 stores a set of corresponding internal parameter values, the interpolator 246 is configured to use an interpolation technique to map the control signal level to a corresponding set of internal parameter values. Any suitable interpolation technique may be used, and in one embodiment the interpolation technique that results in the most perceptually pleasing transition between predetermined control signal levels is used. In one embodiment, the interpolator is configured to linearly interpolate between the respective sets of internal parameters that correspond to the predetermined control signal levels closest to the actual control signal level. In alternative embodiments, interpolation may not be used, and control signal levels may be mapped to internal parameter values in some other way, such as by using a mapping function. In one approach, the control signal may have one of a prescribed set of discrete values and each discrete value is mapped to a corresponding set of values for the internal parameters. Referring further to FIG. 2B, the set of internal parameter values determined by the interpolator 246 is provided as output on line 250. In one embodiment, the output provided on line 250 is provided to an attribute mixer, such as attribute mixer 224 of FIG. 2A. In an embodiment in which only one attribute control is present, the internal parameters provided on line 250 may be provided directly to one or more signal processing modules.

Figure 2C:
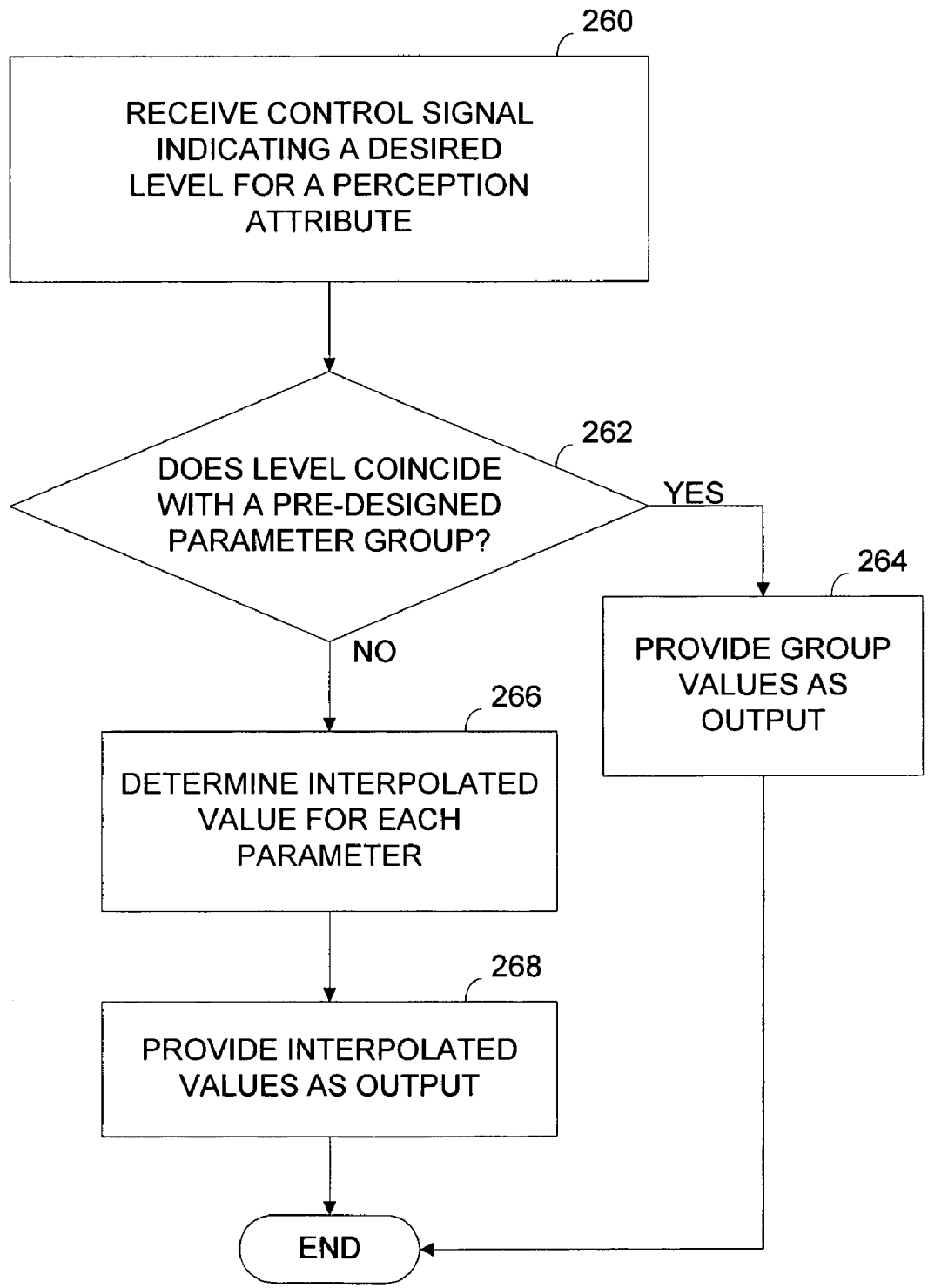
FIG. 2C is a flow chart illustrating a process used in one embodiment to generate a set of one or more internal parameter values based on a control signal level, such as may be implemented by the interpolator 246 of FIG. 2B.

FIG. 2C is a flow chart illustrating a process used in one embodiment to generate a set of one or more internal parameter values based on a control signal level, such as may be implemented by the interpolator 246 of FIG. 2B. In step 260, a control signal indicating a desired level for a perceptual attribute is received. In step 262, it is determined whether the level of the control signal coincides with one of a predetermined number of predetermined control signal levels each of which corresponds to a set of values for one or more internal parameters. If it is determined in step 262 that the level does coincide with one of the predetermined levels, the process proceeds to step 264 in which the corresponding set of internal parameter values is provided as output, after which the process ends. If it is instead determined in step 262 that the control signal level does not coincide with one of the predetermined levels, the process advances to step 266 in which an interpolation technique is used to generate an appropriate set of internal parameter values for the received control signal. In step 268, the interpolated values are provided as output, after which the process ends.

Figure 3:
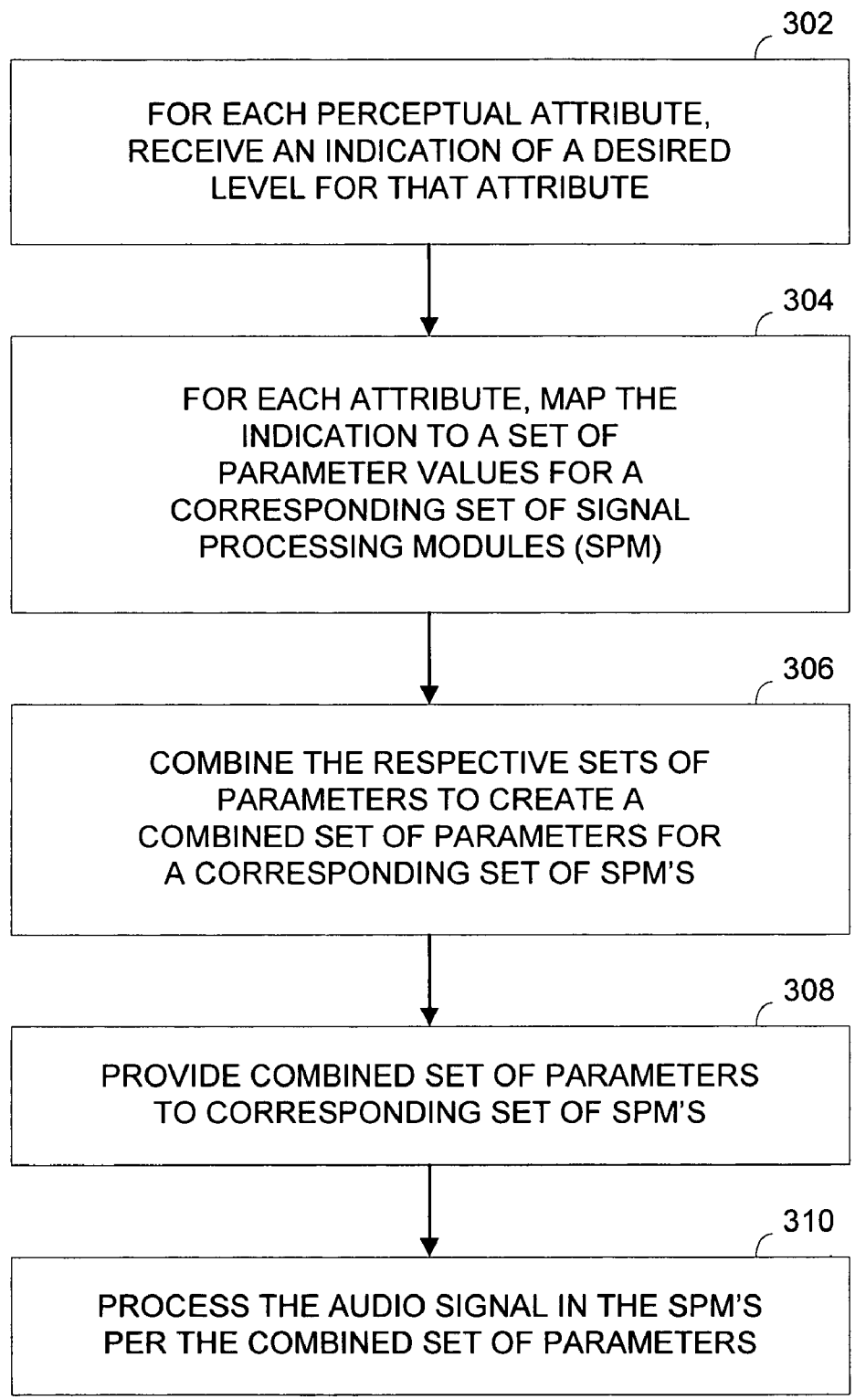
FIG. 3 is a flow chart illustrating a process used in one embodiment to process an audio signal to achieve desired levels for a plurality of perceptual attributes.

FIG. 3 is a flow chart illustrating a process used in one embodiment to process an audio signal to achieve desired levels for a plurality of perceptual attributes. In step 302, for each perceptual attribute an indication is received of a desired level for that attribute. In one embodiment, the indication received in step 302 may be an input received via a user interface. In one embodiment, the indication received in step 302 may be a value associated with a user input, such as the values generated by block 208 of FIG. 2A. In step 304, the indication for each attribute is mapped to a set of parameter values for a corresponding set of signal processing modules. The set of affected signal processing modules for each perceptual attribute may be the same, partly the same, or entirely different, as determined in one embodiment by a sound designer based on such considerations as the perceptual attributes being modified, the signal processing modules used to modify them, and the particular configuration. In one embodiment, the attribute-specific sets of parameters may be generated by a set of attribute engines, such as the attribute engines 222 of FIG. 2A. In step 306, the respective sets of parameters are combined to create a combined set of parameters for a corresponding set of signal processing modules. In one embodiment, an attribute mixer such as the attribute mixer 224 of FIG. 2A may generate the combined set of parameters. In step 308, the combined set of parameters is provided to the corresponding signal processing modules. In step 310, the signal processing modules process the audio signal based at least in part on the parameters.

Figure 4:
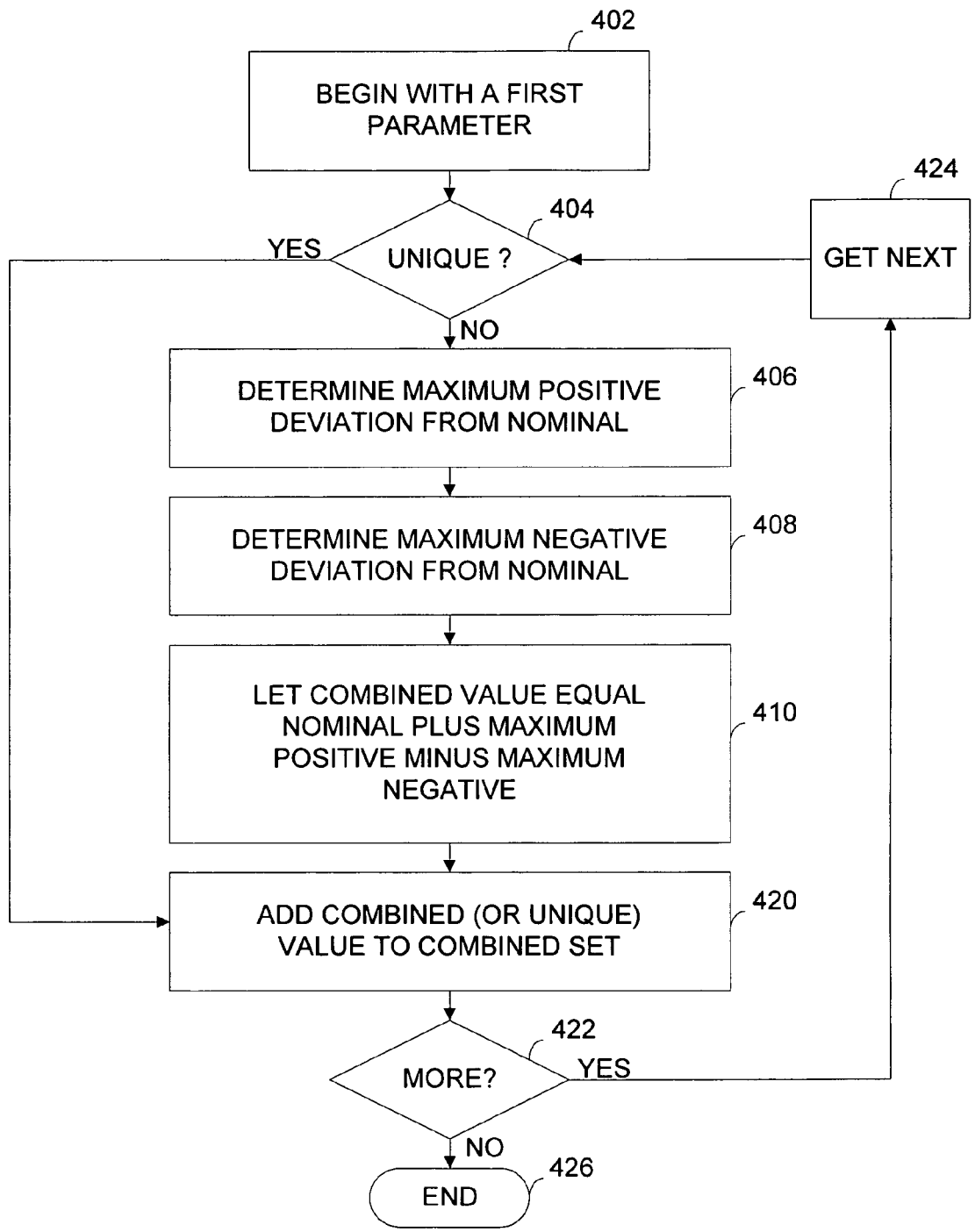
FIG. 4 is a flow chart illustrating a process used in one embodiment to combine perceptual attribute-specific sets of parameters to generate a combined set of parameters, as in step 306 of FIG. 3.

FIG. 4 is a flow chart illustrating a process used in one embodiment to combine perceptual attribute-specific sets of parameters to generate a combined set of parameters, as in step 306 of FIG. 3. In step 402, the process begins with consideration of a first parameter from one of the attribute-specific sets of parameters. In step 404, it is determined whether the parameter is unique, i.e., whether any other attribute-specific set of parameters also includes a value for the same signal processing module parameter. If it is determined in step 404 that the parameter value is unique, i.e., no other attribute-specific set of parameters includes a value for that parameter, the process advances to step 420, in which the parameter value is added to the combined set of parameters as the final value for that parameter. If it is determined in step 404 that the parameter value is not unique, i.e., one or more other attribute-specific sets of parameters include a value for the same parameter, the process proceeds to step 406, in which all of the values for the parameter, across all of the attribute-specific sets of values that include a value for that parameter, are considered to determine which value represents the maximum positive deviation from the nominal value for that parameter. Depending on the implementation of a particular signal processing module, the nominal value may be a null value (e.g., no or minimal modification to the audio signal), a minimum or maximum value for the parameter, or some other value as determined by a system designer, e.g., a sound designer in the case of an audio signal processing embodiment. For example, if the nominal value for a parameter were "1" and three attribute-specific sets of parameters each had a value for the parameter, e.g., values of −2, 1, and 5, respectively, the value representing the maximum positive deviation from the nominal value would be identified in step 406 as being the value 5 and the maximum positive deviation would be determined to be 4 (i.e., 5−1). In step 408, the maximum negative deviation from the nominal value for the parameter is determined. In the above example, in which the nominal value is 1 and the attribute-specific values are −2, 1, and 5, the value representing the maximum negative deviation is −2 and the maximum negative deviation is 3 (i.e., 1−(−2)). Note that depending on the nominal value and the respective attribute-specific values for a parameter, the value with the maximum negative deviation from the nominal value may be a positive value. In one embodiment, if there is no parameter value greater than the nominal value the maximum positive deviation is considered to be zero and, likewise, if there is no parameter value less than the nominal value the maximum negative deviation is considered to be zero. In step 410, the combined value for the parameter under consideration is set to be equal to the nominal value plus the maximum positive deviation minus the maximum negative deviation. In the example described above, the combined value would equal 1+4−3=2. In other embodiments, algorithms for combining multiple values for a parameter other than the approach embodied in steps 406, 408, and 410 of FIG. 4 may be used. In step 420, the combined value calculated in step 410 for the parameter is added to the combined set of parameters as the value for the corresponding parameter. Once either the unique parameter or the combined parameter has been added in step 420 to the combined set of parameters, it is determined in step 422 whether any further attribute-specific parameter values remain to be processed, i.e., whether there are any remaining parameters in any attribute-specific set of parameter values that have not yet been added to the combined set of parameters (if unique) or combined with the corresponding values from other attribute-specific sets (if not unique). If it is determined in step 422 that there are more attribute-specific parameter values to be processed, the process advances to step 424, in which a next attribute-specific parameter value is identified for processing, and the next parameter value is processed as indicated in steps 404, 406, 408, 410, and 420, as described above. If it is determined in step 422 that no attribute-specific parameter values remain to be processed, the process shown in FIG. 4 ends in step 426.

The process illustrated in FIG. 4 and described above is only one example of a process by which a plurality of values for an internal parameter may be combined and/or reconciled, and in other embodiments other algorithms may be used. For example, and without limitation, one possible alternative approach would be to calculate a mean (e.g., arithmetic, geometric, median, or any other mean or weighted version thereof) of the attribute-specific parameter values. However, a mean-based approach would make the individual control design much more difficult and the ranges of parameter values would get compromised. In the deviation-based approach described above, the resolved output parameters arrived at by combining two or more attribute-specific parameter values can take on the same range as they would if only one of the attribute controls were the only control input. For example, if an attribute control A were configured to generate an attribute-specific value for a parameter X in the range of 0 to 80 and an attribute control B were configured to generate an attribute-specific value for the parameter X in the range from 0 to 100, under the deviation approach, assuming the nominal value for X was 0, a maximum setting for both A and B would result in a combined value of 100 for the parameter X (in fact, a maximum setting for B combined with any setting for A would result in X=100), whereas under an averaging or arithmetic mean approach the maximum achievable value would be 90 (i.e., with both A and B set to the maximum position, such that X=(80+100)/2), meaning that a system with only attribute control B could achieve a wider range of parameter values than a system with both attribute controls A and B using an averaging approach to combine the inputs.

In one alternative embodiment to the approach described above, the attribute controls are configured to be adjustable in discrete increments, such that a discrete point in the parameter space exists for every possible combination of attribute control settings. For each such point, a sound designer or other expert establishes a corresponding set of values for the internal parameters. In such an embodiment, it would not be necessary to combine or reconcile dynamically internal parameter values corresponding to two or more individual attribute controls. However, the task of establishing in advance the mapping of the plurality of discrete points to corresponding sets of values for the internal parameters would be much more complex and time consuming and may add significant cost.

Figure 5:
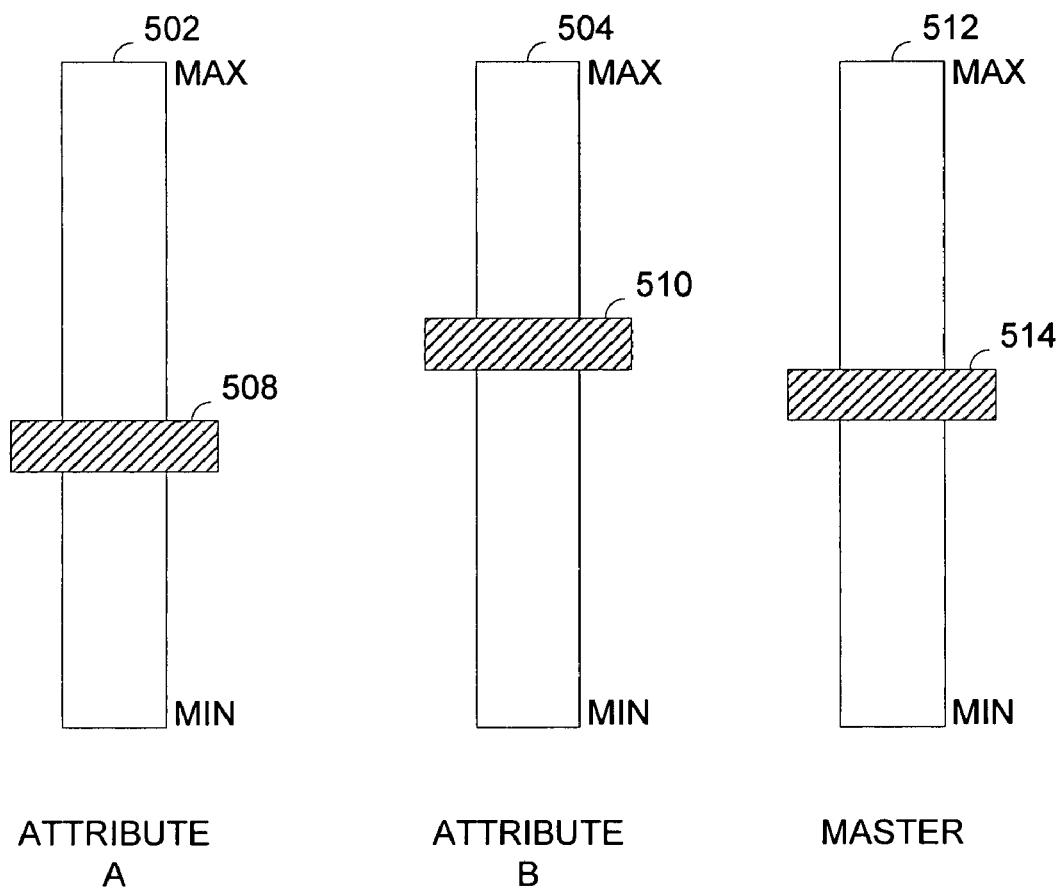
FIG. 5 illustrates a set of controls that includes a master control similar in function to the master control 204 of FIG. 2.

FIG. 5 illustrates a set of controls that includes a master control similar in function to the master control 204 of FIG. 2. The set of controls 500 comprises individual attribute controls 502 and 504. Attribute A control 502 comprises a level indicator 508 which may be positioned along the control 502 to indicate a desired level for attribute A between a minimum level and a maximum level. Likewise, attribute B control 504 comprises a level indicator 510 which may be positioned along the control 504 to indicate a desired level for the attribute between a minimum level and a maximum level. Master control 512 comprises a level indicator 514, which may be positioned along the master control 512 to indicate a desired change in the levels for both attribute A and attribute B. In one embodiment, the master control 512 is configured to meet several constraints. First, the master slider is configured such that when the master control is at the minimum position, the values for the individual attributes should correspond to the values generated when the individual attribute controls are both (or all, if more than two) in their respective minimum positions. Likewise, when the master control is at the maximum position, the values for the individual attributes should correspond to the values generated when the individual attribute controls are both (or all, if more than two) in their respective maximum positions. In addition, adjustment of the individual attribute controls must change the level indicator of the master control in a way that is consistent with how the master control affects the individual controls. For example, if setting the master slider to a position M results in attribute values {A1, B1}, then setting the individual attribute controls to the same values, i.e., setting attribute control 502 to A1 and attribute control 504 to B1, regardless of the starting point, must result in the master setting being M. A related constraint in one embodiment is that if an attribute setting is increased the master setting must increase, and if an attribute setting is decreased the master setting must decrease. In other embodiments, increasing the master slider may increase some attribute settings and decrease others. This aspect of user controllability is implemented in one embodiment by making the user-selected set of attribute values pivotal in determine the subsequent behavior of the master control.

Although the controls illustrated in FIG. 5 are shown as slider type controls, any type of control may be used, including without limitation knobs, dials, buttons, digital displays, or any display or interface that enables a user to indicate a desired level.

FIGS. 6A-6D illustrate four possible approaches to mapping master control settings to attribute values. In the examples shown in FIGS. 6A-6D, the minimum values for attributes A and B are assumed for purposes of convenience and illustration to be zero. Also, while two attributes are shown in FIGS. 6A-6D, those of skill in the art will recognizes that the same techniques may be applied to map a master control to any number of corresponding individual attribute controls. The point P indicates a pivot point. In one embodiment, the pivot point corresponds to the last set of control settings indicated by moving an individual attribute control or by loading a preset. The point S indicates the source, corresponding in the example shown to minimum attribute values for both attributes A and B, i.e., point (MIN, MIN) in the parameter space shown in FIGS. 6A-6D. In one embodiment, the minimum value for both attribute A and attribute B is zero; however, the minimum value may be some other value depending on the attribute, the signal processing module(s) used to achieve a desired level for the attribute, and/or other factors. In some embodiments, the value at the source for one or more of the attributes may be something other than the minimum value, e.g., the maximum value or some other value. The point D indicates a destination point corresponding in the example shown to the maximum attribute values (MAX, MAX). In some embodiments, the maximum value for one attribute may be different than the maximum value for one or more other attributes. Note that the labels "source" and "destination" are arbitrary and are not intended to suggest a unidirectional trajectory. Also, while in the example shown the source corresponds to minimum values for all the attributes and the destination corresponds to maximum values, in other embodiments any arbitrary trajectory endpoints and/or intermediate points of the trajectory of the master control through the parameter space may be defined.

Figure 6A:
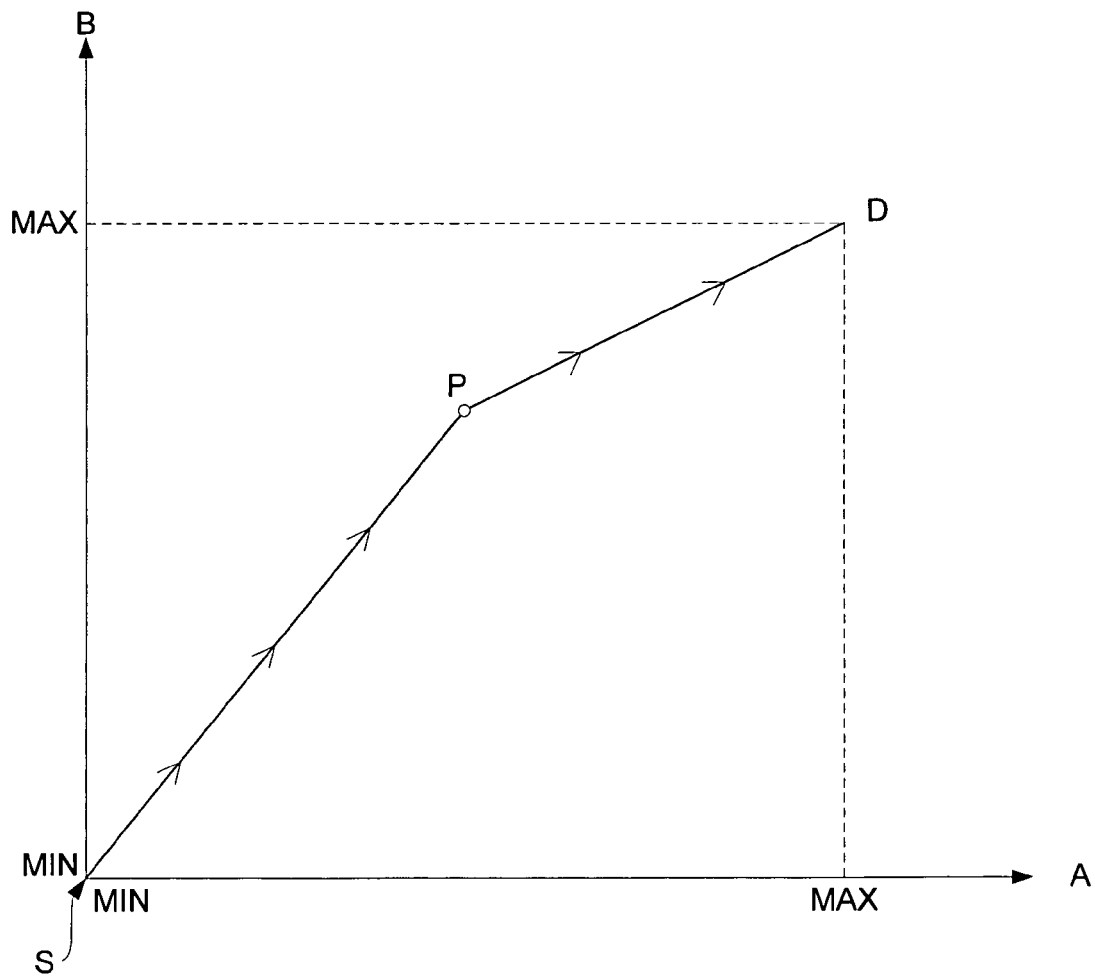
FIG. 6A illustrates a "direct" approach to mapping the level of a master control to corresponding levels for two or more attribute-specific controls.

In FIG. 6A, labeled the "direct" approach, the pivot P is established by the user based on the last adjustment by the user of an attribute-specific control. In some embodiments, the pivot point may in addition or instead be established by the selection of a preset. Under the direct approach, the attribute settings corresponding to the movement of the master control between its position at the pivot point and its maximum position are indicated by the segment from P to D, and the attribute settings corresponding to the movement of the master control between its position at the pivot point and its minimum (e.g., zero) position are indicated by the segment from P to S.

Figure 6B:
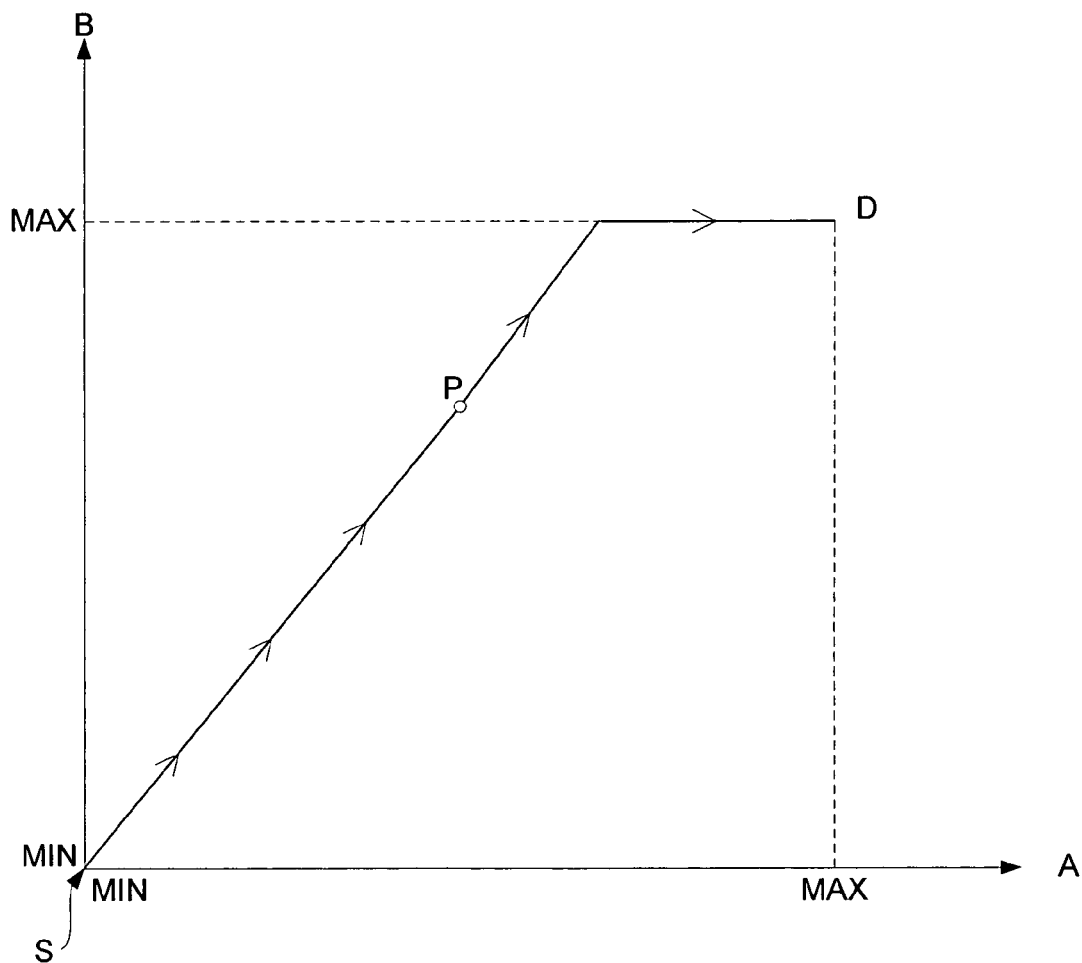
FIG. 6B illustrates a "linear" approach to mapping the level of a master control to corresponding levels for two or more attribute-specific controls.

Under the "linear" approach illustrated in FIG. 6B, a constant relative proportion of attribute settings is maintained by following a linear trajectory defined by the source S and pivot point P. When the line intersects the parameter space boundary, i.e., when the value for attribute B reaches its maximum in the example shown in FIG. 6B, the trajectory follows the parameter space boundary to the destination D. Under this approach, there will be some range of motion for the master control for which there is no corresponding change in at least one individual attribute control/setting, because at least one value will reach its maximum before the maximum position of the master control is reached.

Figure 6C:
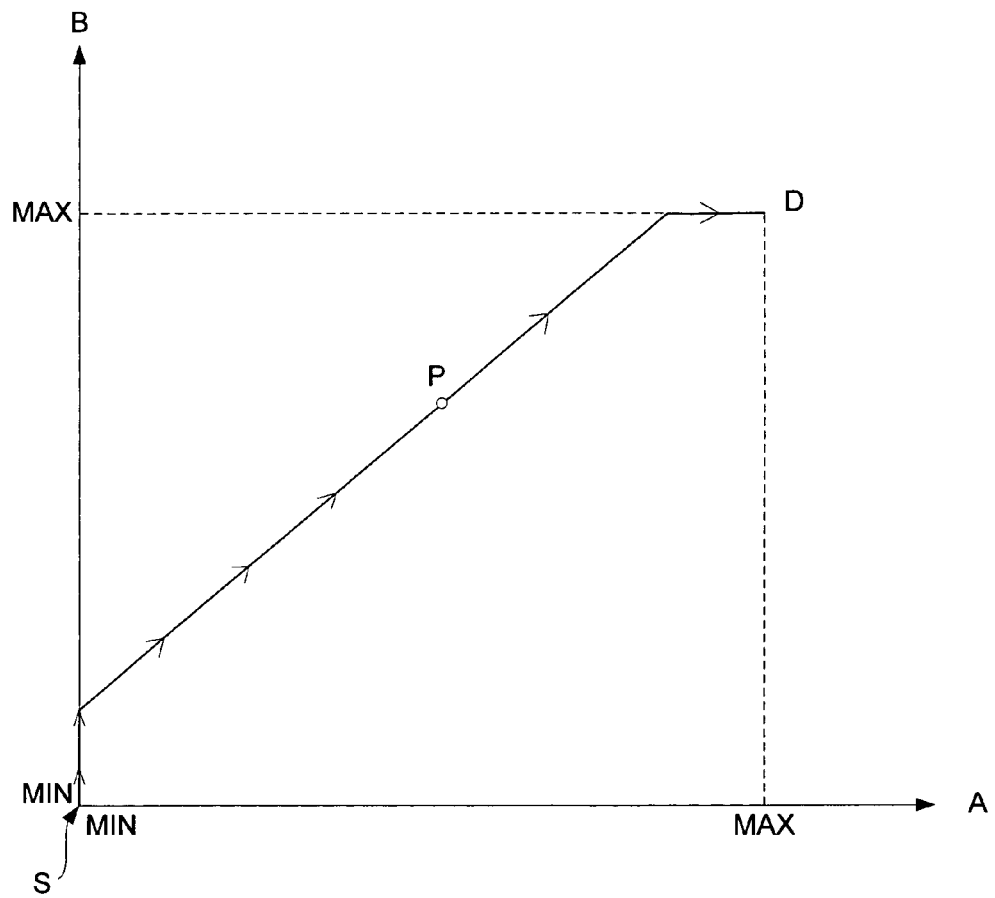
FIG. 6C illustrates an "equal increment" approach to mapping the level of a master control to corresponding levels for two or more attribute-specific controls.

FIG. 6C illustrates the "equal increment" approach, in which a constant relative difference between the attribute settings is maintained. Under this approach, if the master control is increased or decreased, the attribute settings are increased or decreased by an equal amount (i.e., the trajectory has a slope of one), unless/until a boundary of the parameter space is reached.

Figure 6D:
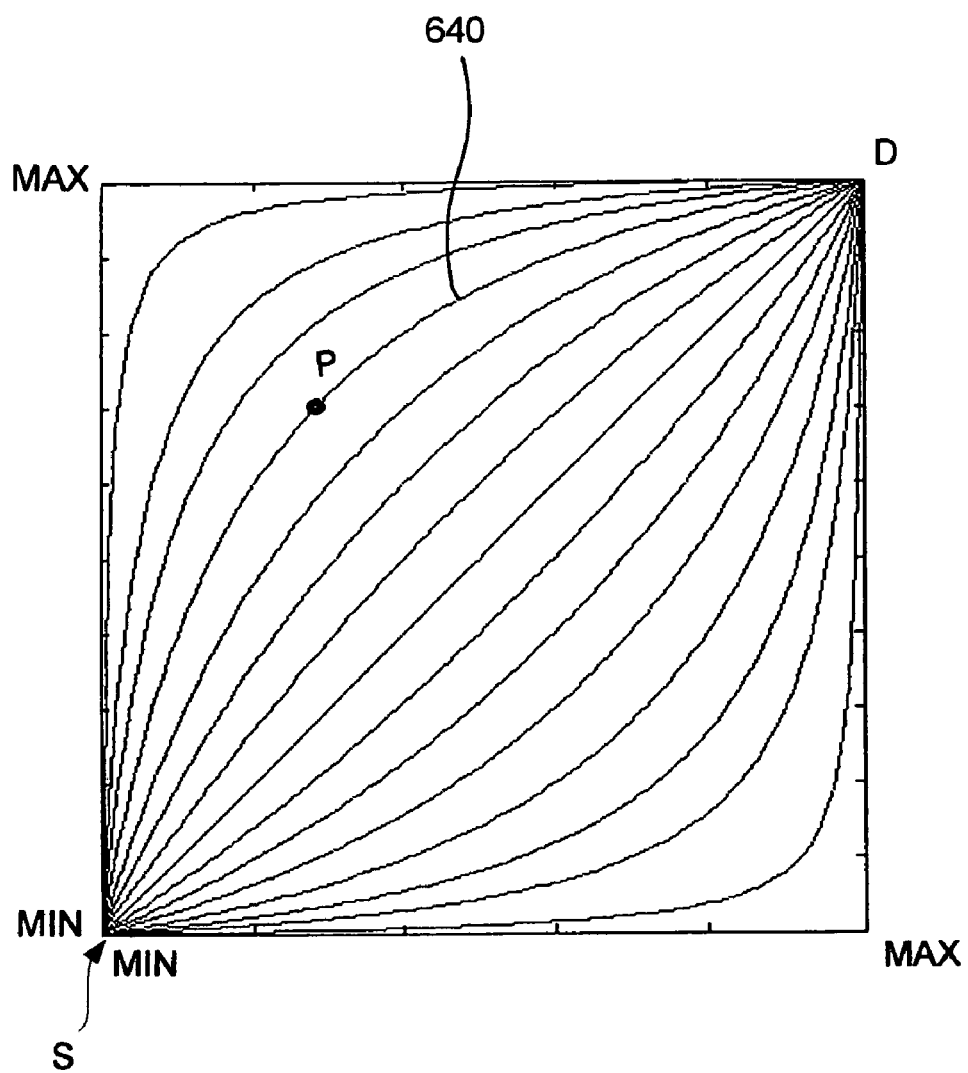
FIG. 6D illustrates a nonlinear function approach to mapping the level of a master control to corresponding levels for two or more attribute-specific controls.

FIG. 6D illustrates the "nonlinear function" approach, in which a set of nonlinear functions is used to define the relationship between the master and attribute controls. Under the "nonlinear function" approach, for any given pivot point P the nonlinear curve of the family shown in FIG. 6D (or any other family of nonlinear curves) that passes through (or nearest to) P is used to define the relationship between the master control and the attribute controls. In one embodiment, a family of nonlinear curves is defined such that for any given P a nonlinear curve of the family could be determined that passes through it. In the example shown in FIG. 6D, the curve 640 passes through the pivot point P and, as such, becomes the curve used to map subsequent adjustments to the master control to corresponding values for the individual attributes.

While four possible approaches are shown in FIGS. 6A-6D for mapping master control settings to attribute settings, other approaches are possible and contemplated. For example, and without limitation, a predesigned mapping function may be used to define the trajectory of the master control settings within the parameter space, e.g., based on a pivot point established as described above. Also, in some embodiments increasing the master control might result in an increase in some attributes but a decrease in others, and likewise a decrease in the master control might result in a decrease in some attributes and an increase in others.

In one embodiment, consistency between the master control level and the respective levels of the individual attribute controls is maintained by defining the level of the master control to be equal to the sum of the (normalized) individual attribute levels divided by the number of individual attribute controls associated with the master control. In one embodiment, as one or more individual attribute controls are moved the master control level indicator moves a corresponding amount so as to maintain the above-described relationship between the individual attribute control levels and the master control level.

Using the techniques described herein, attribute settings for two or more attributes may be combined and reconciled to generate parameters for one or more signal processing modules even where two or more individual attribute controls each seek to control or influence the same internal parameter. In addition, a master control may be provided to enable a user to modify the level of more than one attribute by adjusting a single control.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method for a system to map a plurality of external control signals to values for one or more internal parameters, comprising:
    mapping each external control signal to a control signal-specific set of internal parameter values corresponding to the level of the signal, wherein each external control signal to the signal processing module is independently adjustable;
    combining the resulting signal-specific sets of internal parameter values to generate a combined set of internal parameter values;
    wherein the combined set of internal parameter values comprises (1) a single value for each internal parameter for which a value was included in at least one signal-specific set of internal parameter values and (2) for each internal parameter for which a value is included in more than one of the signal-specific sets of internal parameter values, a combined value based at least in part on the values included in the signal-specific sets of internal parameter values;
    wherein mapping each external control signal to a control signal-specific set of internal parameter values corresponding to the level of the signal comprises:
        determining if the level has associated with it a predesigned set of values for one or more of said internal parameters;
        in the event it is determined that the level has a predesigned set of values for one or more of said internal parameters associated with it, using the predesigned set of values as the control signal-specific set of internal parameter values for that signal; and
        in the event it is determined that the level does not have a predesigned set of values for one or more of said internal parameters associated with it, using interpolation to generate the control signal-specific set of internal parameter values.

2. The method of claim 1, wherein each internal parameter value comprises a value for an internal parameter of an audio signal processing system.

3. The method of claim 1, wherein each internal parameter value comprises a value for a control parameter for one or more modules of a modular audio signal processing system.

4. The method of claim 1, wherein at least one internal parameter comprises a gain.

5. The method of claim 1, wherein at least one internal parameter comprises an exponent.

6. The method of claim 1, wherein at least one internal parameter comprises a slope.

7. The method of claim 1, wherein at least one internal parameter comprises a coefficient.

8. The method of claim 1, wherein at least one internal parameter comprises a modification factor.

9. The method of claim 1, wherein at least one internal parameter comprises a maximum value.

10. The method of claim 1, wherein at least one internal parameter comprises a minimum value.

11. The method of claim 1, wherein at least one internal parameter comprises a threshold value.

12. The method of claim 1, wherein combining the resulting control signal-specific sets of internal parameter values to generate a combined set of internal parameter values comprises for each internal parameter for which more than one control signal-specific set of internal parameter values includes a value:
    determining a maximum positive deviation from a nominal value for the internal parameter;

determining a maximum negative deviation from the nominal value for the internal parameter; and calculating a combined value for the internal parameter by adding the maximum positive deviation to the nominal value and subtracting the maximum negative deviation from the result.

13. A method for a system to map a plurality of external control signals to values for one or more internal parameters, comprising:

mapping each external control signal to a control signal-specific set of internal parameter values corresponding to the level of the signal, wherein each external control signal to the signal processing module is independently adjustable;

combining the resulting signal-specific sets of internal parameter values to generate a combined set of internal parameter values, wherein the combined set of internal parameter values comprises (1) a single value for each internal parameter for which a value was included in at least one signal-specific set of internal parameter values and (2) for each internal parameter for which a value is included in more than one of the signal-specific sets of internal parameter values, a combined value based at least in part on the values included in the signal-specific sets of internal parameter values;

receiving a master control signal; and mapping the master control signal to a respective value for two or more of said plurality of external control signals;

wherein the master control signal corresponds to a level to which a master control is set, each of the plurality of external controls signals that is associated with the master control signal corresponds to a level to which a corresponding individual control has been set, and mapping the master control signal to a respective value for two or more of said plurality of external control signals comprises:

establishing in a parameter space comprising the possible combinations of settings of the individual controls associated with the master control a pivot point corresponding to the setting of each individual control at the conclusion of a last adjustment by a user that resulted in a change in the setting of one or more of the individual controls; and establishing in the parameter space a trajectory based on the pivot point for mapping settings to which the master control is adjusted to corresponding values for each of the individual controls.

14. The method of claim 13, wherein said last adjustment by a user that resulted in a change in the setting of one or more of the individual controls comprises an adjustment of an individual control.

15. The method of claim 13, wherein last adjustment by a user that resulted in a change in the setting of one or more of the individual controls comprises selection of a preset.

16. The method of claim 13, wherein the trajectory comprises a source point that corresponds to a minimum setting for each of the individual controls associated with the master control.

17. The method of claim 13, wherein the trajectory comprises a destination point that corresponds to a maximum setting for each of the individual controls associated with the master control.

18. The method of claim 13, wherein the trajectory comprises:

the direct path between the pivot point and a destination point for master control settings in the range between the master control setting corresponding to the pivot point and the maximum master control setting; and the direct path between the pivot point and a source point for master control settings in the range between the master control setting corresponding to the pivot point and the minimum master control setting.

19. The method of claim 13, wherein the trajectory comprises:

for master control settings in the range between the master control setting corresponding to the pivot point and the maximum master control setting, the path between the pivot point and a destination point by which the relative proportion of the respective individual settings is maintained until a boundary of the parameter space is reached and thereafter continuing along the boundary in the direction of the destination point with respect to any individual setting corresponding to a parameter space boundary that has been reached; and the direct path between the pivot point and a source point for master control settings in the range between the master control setting corresponding to the pivot point and the minimum master control setting.

20. The method of claim 13, wherein the trajectory comprises:

for master control settings in the range between the master control setting corresponding to the pivot point and the maximum master control setting, the path along which a constant relative difference between the individual settings is maintained, until a boundary of the parameter space is reached, and thereafter continuing along the boundary in the direction of a destination point with respect to any individual setting corresponding to a parameter space boundary that has been reached; and for master control settings in the range between the master control setting corresponding to the pivot point and the minimum master control setting, the path along which a constant relative difference between the individual settings is maintained, until a boundary of the parameter space is reached, and thereafter continuing along the boundary in the direction of a source point with respect to any individual setting corresponding to a parameter space boundary that has been reached.

21. The method of claim 13, wherein consistency is maintained between the master control and the individual controls by defining the master control setting to be equal to the sum of the individual control settings divided by the number of individual controls.

22. The method of claim 13, wherein if one or more of the individual controls is adjusted, either individually or by loading a preset, consistency is maintained between the master control and the individual controls by changing the setting of the master control such that it continues to be equal to the sum of the individual control settings divided by the number of individual controls.

23. A system configured to map a plurality of external control signals to values for one or more internal parameters, comprising:

an interface configured to receive said external control signals; and a processor configured to map each external control signal to an control signal-specific set of internal parameter values corresponding to the level of the control signal and combine the resulting control signal-specific sets of internal parameter values to generate a combined set of internal parameter values, each external control signal being independently adjustable;

wherein the combined set of internal parameter values comprises (1) a single value for each internal parameter for which a value was included in at least one control signal-specific set of internal parameter values and (2) for each internal parameter for which a value is included in more than one of the control signal-specific sets of internal parameter values, a combined value based at least in part on the values included in the control signal-specific sets of internal parameter values;

wherein mapping each external control signal to a control signal-specific set of internal parameter values corresponding to the level of the signal comprises:
- determining if the level has associated with it a predesigned set of values for one or more of said internal parameters;
- in the event it is determined that the level has a predesigned set of values for one or more of said internal parameters associated with it, using the predesigned set of values as the control signal-specific set of internal parameter values for that signal; and
- in the event it is determined that the level does not have a predesigned set of values for one or more of said internal parameters associated with it, using interpolation to generate the control signal-specific set of internal parameter values.

24. A computer program product for mapping a plurality of external control signals to values for one or more internal parameters, the computer program product being embodied in a non-transitory computer readable medium and comprising computer readable code for:

mapping each external control signal to a control signal-specific set of internal parameter values corresponding to the level of the signal, wherein each external control signal is independently adjustable; and combining the resulting signal-specific sets of internal parameter values to generate a combined set of internal parameter values;

wherein the combined set of internal parameter values comprises (1) a single value for each internal parameter for which a value was included in at least one signal-specific set of internal parameter values and (2) for each internal parameter for which a value is included in more than one of the signal-specific sets of internal parameter values, a combined value based at least in part on the values included in the signal-specific sets of internal parameter values;

wherein mapping each external control signal to a control signal-specific set of internal parameter values corresponding to the level of the signal comprises:
- determining if the level has associated with it a predesigned set of values for one or more of said internal parameters;
- in the event it is determined that the level has a predesigned set of values for one or more of said internal parameters associated with it, using the predesigned set of values as the control signal-specific set of internal parameter values for that signal; and
- in the event it is determined that the level does not have a predesigned set of values for one or more of said internal parameters associated with it, using interpolation to generate the control signal-specific set of internal parameter values.

\* \* \* \* \*